United States Patent
Suzuki et al.

(10) Patent No.: US 8,618,555 B2
(45) Date of Patent: Dec. 31, 2013

(54) SILICON CARBIDE SEMICONDUCTOR DEVICE AND METHOD OF MANUFACTURING THE SAME

(75) Inventors: Naohiro Suzuki, Anjo (JP); Hideo Matsuki, Obu (JP); Masahiro Sugimoto, Toyota (JP); Hidefumi Takaya, Miyoshi (JP); Jun Morimoto, Nisshin (JP); Tsuyoshi Ishikawa, Nisshin (JP); Narumasa Soejima, Seto (JP); Yukihiko Watanabe, Nagoya (JP)

(73) Assignees: DENSO CORPORATION, Kariya (JP); Toyota Jidosha Kabushiki Kaisha, Toyota (JP)

( * ) Notice: Subject to any disclaimer, the term of this patent is extended or adjusted under 35 U.S.C. 154(b) by 193 days.

(21) Appl. No.: 13/117,575

(22) Filed: May 27, 2011

(65) Prior Publication Data
US 2011/0291110 A1 Dec. 1, 2011

(30) Foreign Application Priority Data
May 31, 2010 (JP) .................................. 2010-124604

(51) Int. Cl.
*H01L 29/66* (2006.01)
(52) U.S. Cl.
USPC ................ 257/77; 257/E21.41; 257/E29.066; 438/270

(58) Field of Classification Search
USPC ................ 257/77, E21.41, E29.066; 438/270
See application file for complete search history.

(56) References Cited

U.S. PATENT DOCUMENTS

| 6,133,587 | A * | 10/2000 | Takeuchi et al. | 257/77 |
|---|---|---|---|---|
| 6,627,950 | B1 * | 9/2003 | Bulucea et al. | 257/329 |
| 6,838,730 | B1 * | 1/2005 | Kawaguchi et al. | 257/331 |
| 7,279,743 | B2 * | 10/2007 | Pattanayak et al. | 257/334 |
| 8,193,564 | B2 * | 6/2012 | Suzuki et al. | 257/216 |
| 2004/0195618 | A1 * | 10/2004 | Saito et al. | 257/330 |
| 2007/0181939 | A1 * | 8/2007 | Huang et al. | 257/330 |
| 2008/0230787 | A1 * | 9/2008 | Suzuki et al. | 257/77 |
| 2009/0114969 | A1 | 5/2009 | Suzuki et al. | |
| 2009/0200559 | A1 | 8/2009 | Suzuki et al. | |

\* cited by examiner

*Primary Examiner* — John C Ingham
(74) *Attorney, Agent, or Firm* — Posz Law Group, PLC

(57) ABSTRACT

The silicon carbide semiconductor device includes a substrate, a drift layer, a base region, a source region, a trench, a gate insulating layer, a gate electrode, a source electrode, a drain electrode, and a deep layer. The deep layer is disposed under the base region and is located to a depth deeper than the trench. The deep layer is divided into a plurality of portions in a direction that crosses a longitudinal direction of the trench. The portions include a group of portions disposed at positions corresponding to the trench and arranged at equal intervals in the longitudinal direction of the trench. The group of portions surrounds corners of a bottom of the trench.

11 Claims, 12 Drawing Sheets

SILICON CARBIDE SEMICONDUCTOR DEVICE AND METHOD OF MANUFACTURING THE SAME

CROSS REFERENCE TO RELATED APPLICATIONS

The present application is based on and claims priority to Japanese Patent Application No. 2010-124604 filed on May 31, 2010, the contents of which are incorporated in their entirety herein by reference.

BACKGROUND OF THE INVENTION

1. Field of the Invention

The present invention relates to a silicon carbide (SiC) semiconductor device including a trench gate. The present invention also relates to a method of manufacturing a SiC semiconductor device.

2. Description of the Related Art

Recently, SiC has attracted attention as a material for a power device that can provide a high electric-field breakdown strength. Because a SiC semiconductor device has a high electric-field breakdown strength, the SiC semiconductor device can control a large electric current. Thus, the SiC semiconductor device is expected to be used for controlling a motor of a hybrid car.

In order to increase electric current that flows in a SiC semiconductor device, it is effective to increase a channel density. Thus, in a silicon transistor, a metal-oxide semiconductor field-effect transistor (MOSFET) having a trench gate structure is adopted and is in practical use. Although the trench gate structure can be naturally applied to a SiC semiconductor device, in a case where the trench gate structure is applied to SiC, a big problem arises. Namely, because a breakdown electric-field strength of SiC is 10 times as high as silicon, a SiC semiconductor device is used in a state where a voltage nearly 10 times as high as silicon device is applied to. Thus, electric field of 10 times as high as silicon device is applied to a gate insulating layer formed in a trench provided in SiC, and the gate insulating layer may easily break down at a corner of the trench.

JP-A-2009-194065 (corresponding to US 2009/0200559 A1) discloses a SiC semiconductor device in which a p type deep layer having a stripe pattern is disposed under a p type base region and the p type deep layer intersects with a trench that forms a trench gate structure. In the SiC semiconductor device, due to a depletion layer extending from each of the p type deep layer toward an n-type drift layer, a gate insulating layer is not easily applied with a high voltage. Thus, an electric field concentration in the gate insulating layer can be reduced, and a damage of the gate insulating layer can be reduced.

In the above-described SiC semiconductor device, when a MOSFT is activated, the p type deep layer blocks a current path and reduces a region in which electric current flows. Furthermore, because the p type deep layer has the stripe pattern and all linear sections of the p type deep layer have the same width, that is, all linear sections have the same length in a planar direction of a substrate, the p type deep layer block a large area of the current path and an on-resistance may not be reduced sufficiently.

SUMMARY OF THE INVENTION

In view of the foregoing problems, it is an object of the present invention to provide a silicon carbide semiconductor device that can have an on-resistance. Another object of the present invention is to provide a manufacturing method of a silicon carbide semiconductor device that can reduce an on-resistance.

The silicon carbide semiconductor device according to a first aspect of the present invention includes a substrate, a drift layer, a base region, a source region, a trench, a gate insulating layer, a gate electrode, a source electrode, and a drain electrode. The substrate is made of silicon carbide and has one of a first conductivity type and a second conductivity type. The substrate has first and second opposing surfaces. The drift layer is disposed on the first surface of the substrate. The drift layer is made of silicon carbide. The drift layer has the first conductivity type and has a lower impurity concentration than the substrate. The base region is disposed on the drift layer. The base region is made of silicon carbide and has the second conductivity type. The source region is disposed at a surface portion of the base region. The source region is made of silicon carbide. The source region has the first conductive type and has a higher impurity concentration than the drift layer. The trench is provided from a surface of the source region to a depth deeper than the base region. The trench extends in a predetermined direction. The gate insulating layer is disposed on an inner wall of the trench. The gate electrode is disposed on the gate insulating layer in the trench. The source electrode is electrically coupled with the source region and the base region. The drain electrode is located on the second surface of the substrate. The deep layer is disposed under the base region and is located to a depth deeper than the trench. The deep layer has the second conductivity type. The deep layer is divided into a plurality of portions in a direction that crosses the predetermine direction. The portions include a group of portions disposed at positions corresponding to the trench and arranged at equal intervals in the predetermined direction. The group of portions surrounds corners of a bottom of the trench. In the silicon carbide semiconductor device, an inversion channel is provided at the surface portion of the base region located on the sidewall of the trench and electric current flows between the source electrode and the drain electrode through the source region and the drift layer by controlling a voltage applied to the gate electrode.

In the silicon carbide semiconductor device according to the first aspect, the deep layer is divided into the multiple portions in a direction that crosses the predetermined direction, that is, an extending direction of the trench. Thus, a region through which electric current flows can be expanded at the drift layer between the divided portions of the deep layer, and the amount of electric current that flows between the source electrode and the drain electrode can be increased. As a result, the silicon carbide semiconductor device can have a low on-resistance.

A silicon carbide semiconductor device according to a second aspect of the present invention includes a substrate, a drift layer, a base region, a source region, a trench, a gate insulating layer, a channel layer, a gate electrode, a source electrode, a drain electrode, and a deep layer. The substrate is made of silicon carbide and has one of a first conductivity type and a second conductivity type. The substrate has first and second opposing surfaces. The drift layer is disposed on the first surface of the substrate. The drift layer is made of silicon carbide. The drift layer has the first conductivity type and has a lower impurity concentration than the substrate. The base region is disposed on the drift layer. The base region is made of silicon carbide and has the second conductivity type. The source region is disposed at a surface portion of the base region. The source region is made of silicon carbide. The source region has the first conductive type and has a higher impurity concentration than the drift layer. The trench is provided from a surface of the source region to a depth deeper than the base region. The trench is arranged in a stripe pattern including a plurality of lines extending in a predetermined direction. The gate insulating layer is disposed on an inner wall of the trench. The channel layer is disposed between the base region and the gate insulating layer the trench. The channel layer is made of silicon carbide and has the first conductivity type. The gate electrode is disposed on the gate insulating layer in the trench. The source electrode is electrically coupled with the source region and the base region. The drain electrode is located on the second surface of the substrate. The deep layer is disposed under the base region and is located to a depth deeper than the trench. The deep layer has the second conductivity type. The deep layer is divided into a plurality of portions in a direction that crosses the predetermined direction. The portions include a group of portions disposed at positions corresponding to the trench and arranged at equal intervals in the predetermined direction. The group of portions surrounds corners of a bottom of the trench. In the silicon carbide semiconductor device, an accumulation channel is provided at the channel layer on the sidewall of the trench and electric current flows between the source electrode and the drain electrode through the source region and the drift layer by controlling a voltage applied to the gate electrode.

Also the silicon carbide semiconductor device according to the second aspect can have a low on-resistance.

A silicon carbide semiconductor device according to a third aspect of the present invention includes a substrate, a drift layer, a base region, a source region, a trench, a gate insulating layer, a gate electrode, a source electrode, a drain electrode and a deep layer. The substrate is made of silicon carbide and has one of a first conductivity type and a second conductivity type. The substrate has first and second opposing surfaces. The drift layer is disposed on the first surface of the substrate. The drift layer is made of silicon carbide. The drift layer has the first conductivity type and has a lower impurity concentration than the substrate. The base region is disposed on the drift layer. The base region is made of silicon carbide and has the second conductivity type. The source region is disposed at a surface portion of the base region. The source region is made of silicon carbide. The source region has the first conductive type and has a higher impurity concentration than the drift layer. The trench is provided from a surface of the source region to a depth deeper than the base region. The trench extends in a predetermined direction. The gate insulating layer is disposed on an inner wall of the trench. The gate electrode is disposed on the gate insulating layer in the trench. The source electrode is electrically coupled with the source region and the base region. The drain electrode is located on the second surface of the substrate. The deep layer is disposed under the base region and is located to a depth deeper than the trench. The deep layer has the second conductivity type. The deep layer includes a plurality of sections extending in a direction that crosses the predetermined direction. Each of the sections includes a plurality of portions located at positions corresponding to the trench and a plurality of portions located between adjacent two of the lines. Each of the portions located between adjacent two of the lines is narrower than each of the portions located at the positions corresponding to the trench. In the silicon carbide semiconductor device, an inversion channel is provided at the surface portion of the base region located on the sidewall of the trench and electric current flows between the source electrode and the drain electrode through the source region and the drift layer by controlling a voltage applied to the gate electrode.

In the silicon carbide semiconductor device according to the third aspect, each of the portions of the deep layer located between adjacent two of the lines of the trench is narrower than each of the portions of the deep layer located at the positions corresponding to the trench. Thus, compared with a case where the deep layer has a constant width, a region where electric current flows can be increased. As a result, the silicon carbide semiconductor device can have a low on-resistance.

A silicon carbide semiconductor device according to a fourth aspect of the present invention includes a substrate, a drift layer, a base region, a source region, a trench, a gate insulating layer, a channel layer, a gate electrode, a source electrode, a drain electrode, and a deep layer. The substrate is made of silicon carbide. The substrate has one of a first conductivity type and a second conductivity type. The substrate has first and second opposing surfaces. The drift layer is disposed on the first surface of the substrate. The drift layer is made of silicon carbide. The drift layer has the first conductivity type and has a lower impurity concentration than the substrate. The base region is disposed on the drift layer. The base region is made of silicon carbide and has the second conductivity type. The source region is disposed at a surface portion of the base region. The source region is made of silicon carbide. The source region has the first conductive type and has a higher impurity concentration than the drift layer. The trench is provided from a surface of the source region to a depth deeper than the base region. The trench is arranged in a stripe pattern including a plurality of lines extending in a predetermined direction. The gate insulating layer is disposed on an inner wall of the trench. The channel layer is disposed between the base region and the gate insulating layer in the trench. The channel layer is made of silicon carbide and has the first conductivity type. The gate electrode is disposed on the gate insulating layer in the trench. The source electrode is electrically coupled with the source region and the base region. The drain electrode is located on the second surface of the substrate. The deep layer is disposed under the base region and is located to a depth deeper than the trench. The deep layer has the second conductivity type. The deep layer includes a plurality of sections extending in a direction that crosses the predetermined direction. Each of the sections includes a plurality of portions located at positions corresponding to the trench and a plurality of portions located between adjacent two of the lines. Each of the portions located between adjacent two of the plurality lines is narrower than each of the portions located at the positions corresponding to the trench. In the silicon carbide semiconductor device, an accumulation channel is provided at the channel layer on the sidewall of the trench and electric current flows between the source electrode and the drain electrode through the source region and the drift layer by controlling a voltage applied to the gate electrode.

Also the silicon carbide semiconductor device according to the fourth aspect can have a low on-resistance.

In a method of manufacturing a silicon carbide semiconductor device according to a fifth aspect of the present invention, a substrate made of silicon carbide is prepared. The substrate has one of a first conductivity type and a second conductivity type, and the substrate has first and second opposing surfaces. A drift layer made of silicon carbide is formed on the first surface of the substrate. The drift layer has the first conductivity type and has a lower impurity concentration than the substrate. A deep layer of the second conductivity type is formed at a surface portion of the drift layer by forming a mask having an opening portion on a surface of the drift layer and implanting second conductivity type impurities through the opening portion of the mask. A base region is formed on the deep layer and the drift layer. The base region is made of silicon carbide and has the second conductivity type. A source region made of silicon carbide is formed at a surface portion of the base region by implanting first conductivity type impurities. The source region has the first conductive type and has a higher impurity concentration than the drift layer. A trench is provided from a surface of the source region to the drift layer through the base region. The trench is shallower than the deep layer, and the trench extends in a predetermined direction. A gate insulating layer is formed on an inner wall of the trench. The gate electrode is formed on the gate insulating layer in the trench. A source electrode is formed so as to be electrically coupled with the source region and the base region. A drain electrode is formed on the second surface of the substrate. The deep layer is formed in such a manner that the deep layer is divided into a plurality of portions in a direction that crosses the predetermined direction, the plurality of portions includes a group of portions disposed at positions corresponding to the trench and arranged at equal intervals in the predetermined direction, and the group of portions surrounds corners of a bottom of the trench.

By the method according to the fifth aspect, a silicon carbide semiconductor device having a low on-resistance can be manufactured.

In a method of manufacturing a silicon carbide semiconductor device according to a sixth aspect of the present invention, a substrate made of silicon carbide is prepared. The substrate has one of a first conductivity type and a second conductivity type, and the substrate has first and second opposing surfaces. A drift layer made of silicon carbide is formed on the first surface of the substrate. The drift layer has the first conductivity type and has a lower impurity concentration than the substrate. A deep layer of the second conductivity type is formed at a surface portion of the drift layer by forming a mask having an opening portion on a surface of the drift layer and implanting second conductivity type impurities through the opening portion of the mask. A base region is formed on the deep layer and the drift layer. The base region is made of silicon carbide and has the second conductivity type. A source region made of silicon carbide is formed at a surface portion of the base region by implanting first conductivity type impurities. The source region has the first conductive type and has a higher impurity concentration than the drift layer. A trench is provided from a surface of the source region to the drift layer through the base region. The trench is shallower than the deep layer, and the trench extends in a predetermined direction. A gate insulating layer is formed on an inner wall of the trench. The gate electrode is formed on the gate insulating layer in the trench. A source electrode is formed so as to be electrically coupled with the source region and the base region. A drain electrode is formed on the second surface of the substrate. The deep layer is formed in such a manner that the deep layer includes a plurality of portions located at positions corresponding to the trench and a plurality of portions located between adjacent two of the plurality of lines, each of the plurality of portions located between adjacent two of the plurality of lines is narrower than each of the plurality of portions located at the positions corresponding to the trench.

Also by the method according to the sixth aspect, a silicon carbide semiconductor device having a low on-resistance can be manufactured.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 5A, FIG. 5C, and FIG. 5E are cross-sectional views taken along line IIB-IIB in parallel with the xz plane in FIG. 1, and FIG. 5B, FIG. 5D, and FIG. 5F are cross-sectional views taken along line IID-IID in parallel with the yz plane in FIG. 1;

FIG. 6A, FIG. 6C, and FIG. 6E are cross-sectional views taken along line IIB-IIB in parallel with the xz plane in FIG. 1, and FIG. 6B, FIG. 6D, and FIG. 6F are cross-sectional views taken along line IID-IID in parallel with the yz plane in FIG. 1;

FIG. 9A, FIG. 9C, and FIG. 9E are cross-sectional views taken along line VIIIA-VIIIA in parallel with the xz plane in FIG. 7, and FIG. 9B, FIG. 9D, and FIG. 9F are cross-sectional views taken along line VIIIB-VIIIB in parallel with the yz plane in FIG. 7;

DETAILED DESCRIPTION OF THE PREFERRED EMBODIMENTS

First Embodiment

A SiC semiconductor device according to a first embodiment will be described with reference to FIG. 1 to FIG. 3. The SiC semiconductor device according to the present embodiment includes a MOSFET having an inversion trench gate structure.

Figure 1:
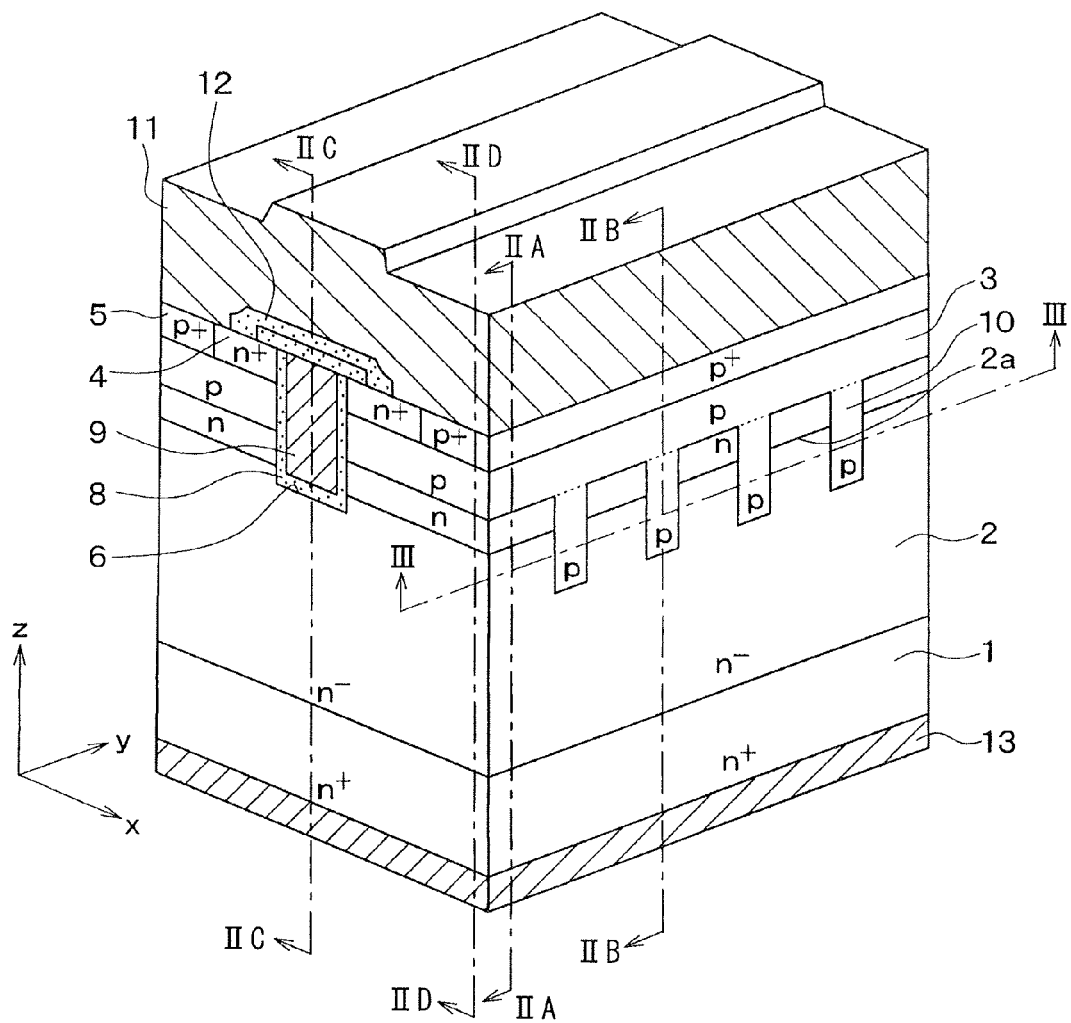
FIG. 1 is a perspective view of a MOSFET according to a first embodiment.
Figure 2A:
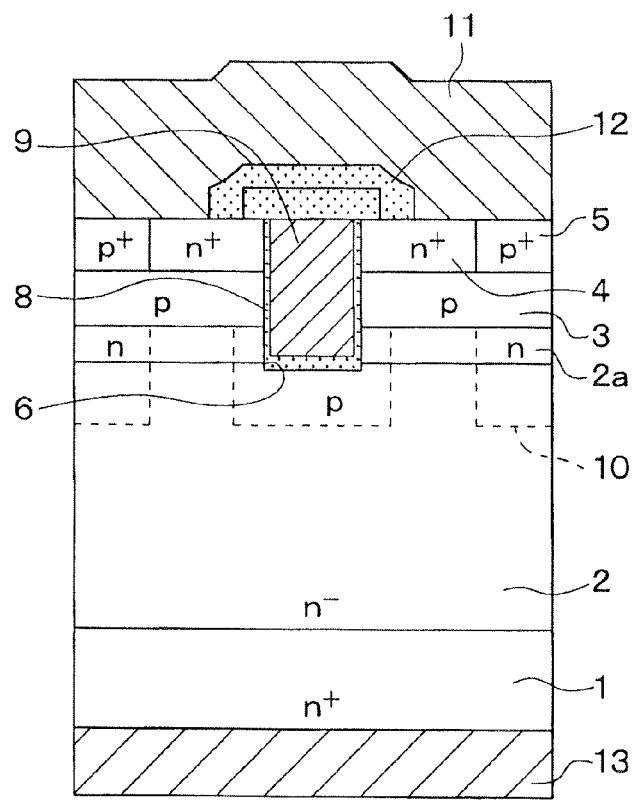
FIG. 2A is a cross-sectional view of the MOSFET taken along line IIA-IIA in parallel with an xz plane in FIG. 1.
Figure 2B:
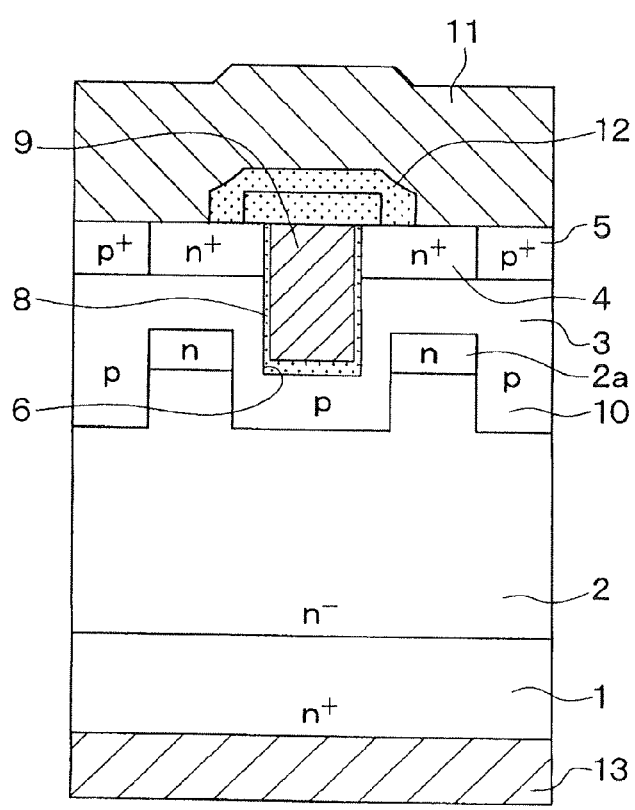
FIG. 2B is a cross-sectional view of the MOSFET taken along line IIB-IIB in parallel with the xz plane in FIG. 1.
Figure 2C:
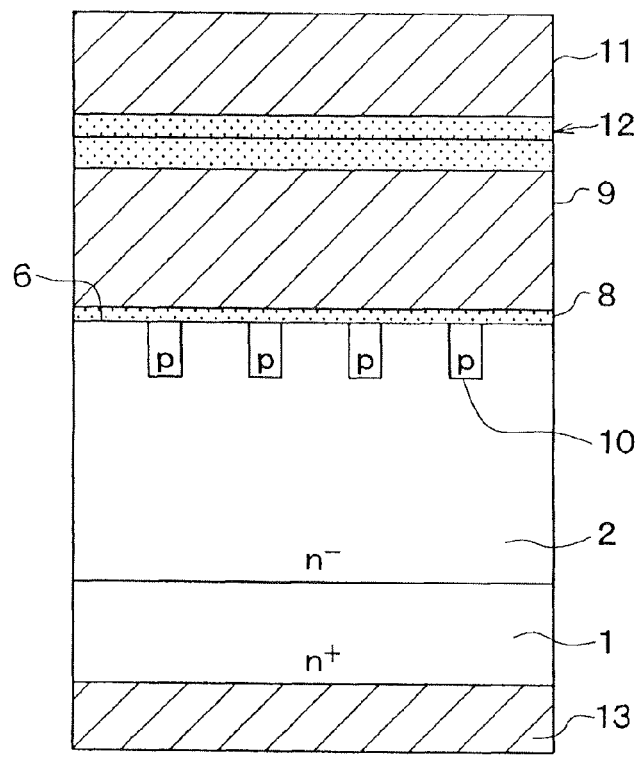
FIG. 2C is a cross-sectional view of the MOSFET taken along line IIC-IIC in parallel with a yz plane in FIG. 1.
Figure 2D:
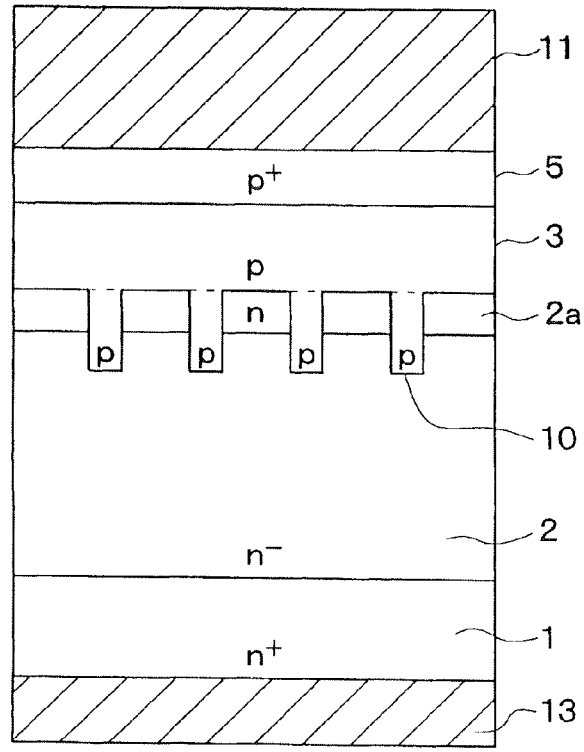
FIG. 2D is a cross-sectional view of the MOSFET taken along line IID-IID in parallel with the yz plane in FIG. 1.

Although only one cell of the MOSFET is shown in FIG. 1, MOSFETs having similar structures are arranged next to each other. FIG. 3 shows a cross section of three cells of MOSFET.

The MOSFET includes an n+ type substrate 1 made of SiC. The n+ type substrate 1 includes n type impurities such as phosphorus and has an n type impurity concentration of, for example, $1.0 \times 10^{19}$ cm$^{-3}$. The n type impurity includes, for example, phosphorus. The n+ type substrate 1 has a thickness of, for example, 300 μm. On a surface of the n+ type substrate 1, an n− type drift layer 2 made of SIC is disposed. The n− type drift layer 2 includes n type impurities such as phosphorus and has an n type impurity concentration of, for example, from $3.0 \times 10^{15}$ cm$^{-3}$ to $7.0 \times 10^{15}$ cm$^{-3}$. The n− type drift layer 2 has a thickness of from 10 μm to 15 μm. The impurity concentration of the n− type drift layer 2 may be substantially constant in a thickness direction of the n− type drift layer 2. However, in the present embodiment, the n− type drift layer 2 includes a current diffusion layer 2a in a surface portion thereof, that is, a portion of the n-type drift layer 2 opposite from n+ type substrate 1. The current diffusion layer 2a has a higher impurity concentration than the other portion of the n− type drift layer 2. The current diffusion layer 2a has an impurity concentration of, for example, from $5.0 \times 10^{16}$ cm$^{-3}$ to $1.5 \times 10^{17}$ cm$^{-3}$ and has a thickness of, for example, from 0.3 μm to 0.7 μm. Furthermore, the n− type drift layer 2 may also have an n type impurity concentration distribution increased from the surface portion toward the n+ type substrate 1. For example, an n type impurity concentration of a portion of the n− type drift layer 2 located at a distance of 3 μm to 5 μm from the surface of the n+ type substrate 1 may be about $2.0 \times 10^{15}$ cm$^{-3}$ higher than the other portion. In the present case, because an internal resistance of the n− type drift layer 2 can be reduced, an on-resistance can be reduced.

In the surface portion of the n− type drift layer 2, a p type base region 3 is disposed. In a surface portion of the p type base region 3, an n+ type source region 4 and a p+ type body layer 5 are disposed.

The p type base region 3 includes p type impurities such as boron or aluminum and has a p type impurity concentration of, for example, from $5.0 \times 10^{16}$ cm$^{-3}$ to $2.0 \times 10^{19}$ cm$^{-3}$. The p type base region 3 has a thickness of, for example, 2.0 μm. The n+ type source region 4 includes n type impurities such as phosphorus. The n+ type source region 4 has an n type impurity concentration of, for example, $1.0 \times 10^{21}$ cm$^{-3}$ at a surface portion thereof. The n+ type source region 4 has a thickness of, for example, 0.3 μm. The p+ type body layer 5 includes p type impurities such as boron or aluminum. The p+ type body layer 5 has a p type impurity concentration of, for example, $1.0 \times 10^{21}$ cm$^{-3}$ at a surface portion thereof. The p+ type body layer 5 has a thickness of, for example, 0.3 μm. The n+ type source region 4 is disposed on either side of a trench gate structure, and the p+ type body layer 5 is disposed on an opposite side of the n+ type source region 4 from the trench gate structure.

The trench gate structure includes a trench 6 that penetrates the p type base region 3 and the n+ type source region 4 to the n− type drift layer 2. The trench 6 has a width of, for example, from 1.4 μm to 2.0 μm. The trench 6 has a depth of, for example, greater than or equal to 2.0 p.m. For example, the trench 6 has a depth of 2.4 μm. The p type base region 3 and the n+ type source region 4 are in contact with sidewalls of the trench 6.

An inner wall of the trench 6 is covered with a gate oxide layer 8. The trench 6 is filled with a gate electrode 9 that is disposed on a surface of the gate oxide layer 8. The gate electrode 9 is made of doped polysilicon. The gate oxide layer 8 is formed by thermally oxidizing the inner wall of the trench 6. The gate oxide layer 8 has a thickness of, for example, 100 nm both on the sidewall and a bottom of the trench 6.

The trench gate structure has the above-described structure. The trench gate structure extends in a predetermined direction. In the present embodiment, the trench gate structure extends in a y-axis direction. The trench gate structure is arranged in an x-axis direction in a stripe pattern. In other words, the trench 6 is arranged in a stripe pattern including a plurality of lines extending in the predetermined direction, and the n+ type source region 4 and the p+ type body layer 5 extend along the predetermined direction. The predetermined direction is also referred to as a longitudinal direction of the trench 6 hereafter.

In the n− type drift layer 2, a p type deep layer 10 is disposed under the p type base region 3. The p type deep layer 10 includes a plurality of portions arranged in a normal direction of the sidewall of the trench 6, that is, in a direction perpendicular to the longitudinal direction of the trench 6. The p type deep layer 10 is located to a depth deeper than the bottom of the trench 6. For example, a depth of the p type deep layer 10 from a surface of the n− type drift layer 2 is 2.6 μm to 3.0 μm and a depth of the p type deep layer 10 from a surface of the p type base region 3 is 0.6 μm to 1.0 μm. The p type deep layer 10 includes p type impurities such as boron or aluminum and has a p type impurity concentration of from $1.0 \times 10^{17}$ cm$^{-3}$ to $1.0 \times 10^{19}$ cm$^{-3}$.

Figure 3:
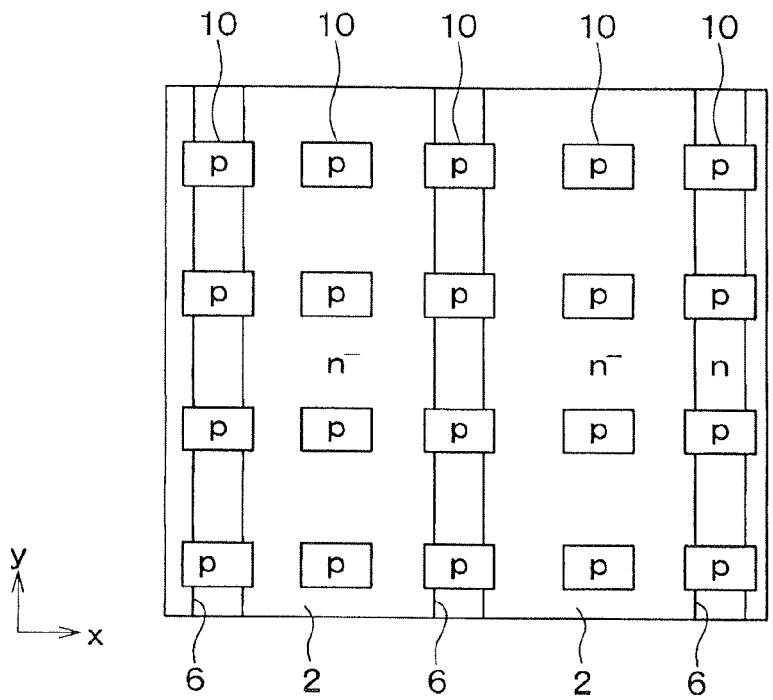
FIG. 3 is a cross-sectional view of the MOSFET taken along line III-III in FIG. 1.

In the present embodiment, as shown in FIG. 3, the p type deep layer 10 has a lattice pattern. Specifically, the p type deep layer 10 includes a plurality of linear sections extending in the x-axis direction, that is, the direction perpendicular to the longitudinal direction of the trench 6 and is arranged in the y-axis direction, that is, in the longitudinal direction of the trench 6. Each of the linear sections includes a plurality of portions arranged in the x-axis direction. In other words, the p type deep layer 10 includes linear sections arranged in a stripe pattern, and each linear section is divided into the multiple portions. The portions of the p type deep layer 10 are classified into a first group and a second group. Each portion in the first group is disposed at a position corresponding to the trench 6. Each portion in the second group is disposed between adjacent two lines of the trench 6. A dimension of each portion in the first group is determined so that each portion can surround corners of the trench 6 at least in the direction perpendicular to the longitudinal direction of the trench 6. In the present embodiment, each portion of the p type deep layer 10 has the same dimension. The portions of the p type deep layer 10 are arranged at equal intervals in the x-axis direction and are arranged at equal intervals in the y-axis direction. For example, each portion of the p type deep layer 10 has a dimension of 2.0 μm in the x-axis direction and 1.5 μm in the y-axis direction, and the intervals of adjacent portions is 2.0 μm in the x-axis direction and 2.5 μm in the y-axis direction.

On surfaces of the n+ type source region 4 and the p+ type body layer 5 and a surface of the gate electrode 9, a source electrode 11 and a gate wiring (not shown) are formed. The source electrode 11 and the gate wiring are made of a plurality of metals, for example, an alloy of nickel and aluminum. At least portions of the source electrode 11 and the gate wiring being in contact with an n type SiC are made of a metal that can provide an ohmic junction between each of the source electrode 11 and the gate wiring and the n type SiC. The n type SiC includes the n+ type source region 4 and the gate electrode 9 if the gate electrode 9 includes n type impurities. At least portions of the source electrode 11 and the gate wiring being in contact with a p type SiC are made of a metal that can provide an ohmic junction between each of the source electrode 11 and the gate wiring and the p type SiC. The p type SiC includes the p+ type body layer 5 and the gate electrode 9 if the gate electrode 9 includes p type impurities. The source electrode 11 and the gate wiring are electrically insulated by being formed on an insulating interlayer 12. Through contact holes provided in the insulating interlayer 12, the source electrode 11 is electrically coupled with the n+ type source region 4 and the p+ type body layer 5, and the gate wiring is electrically coupled with the gate electrode 9.

On a rear surface side of the n+ type substrate 1, a drain electrode 13 electrically coupled with the n+ type substrate 1 is disposed. Thereby, the MOSFET having the n channel inversion trench gate structure is formed.

The present inversion MOSFET may be operated, for example, as described below.

Before applying a gate voltage to the gate electrode 9, an inversion layer is not formed in the p type base region 3. Thus, even if a positive voltage is applied to the drain electrode 13, the positive voltage does not reach the p type base region 3, and electric current does not flow between the source electrode 11 and the drain electrode 13.

When a voltage is applied to the drain electrode 13 while the MOSFET is in an off state (for example, the gate voltage is 0 V, the drain voltage is 650 V, and the source voltage is 0 V), it becomes a reverse bias. Thus, the depletion layer expands from a portion between the p type base region 3 and the n− type drift layer 2 (including the current diffusion layer 2a). Because the concentration of the p type base region 3 is higher than the n− type drift layer 2, the depletion layer expands mostly toward the n− type drift layer 2. For example, in a case where the impurity concentration of the p type base region 3 is 10 times higher than the impurity concentration of the n− type drift layer as the present embodiment, the depletion layer expands about 0.7 μm toward the p type base region 3 and expands about 7.0 μm toward the n− type drift layer 2. However, because the thickness of the p type base region 3 is set to 2.0 μm that is greater than the expanding amount of the depletion layer, a punching through does not occur. Then, because the depletion layer expands more than a case where the drain is 0 V and a region that acts as an insulating body further expands, electric current does not flow between the source electrode 11 and the drain electrode 13.

In addition, because the gate voltage is 0 V, an electric field is applied between the drain and the gate. Therefore, an electric field concentration may occur at the bottom portion of the gate oxide layer 8. However, because the p type deep layer 10 deeper than the trench 6 is provided, the depletion layer at a PN junction of the p type deep layer 10 and the n− type drift layer 2 largely expands toward the n− type drift layer 2, and a high voltage due to the drain voltage is difficult to be applied to the gate oxide layer 8. Especially, when the impurity concentration of the p type deep layer 10 is set to be higher than the p type base region 3, the expanding amount of the depletion layer toward the n− type drift layer further increases. Thereby, an electric field concentration in the gate oxide layer 8, especially, the electric field concentration in the gate oxide layer 8 at the bottom portion of the trench 6 can be reduced, and a damage of the gate oxide layer 8 can be reduced.

According to a simulation, when a voltage of 650 V is applied to the drain electrode 13, electric field strength of the gate oxide layer 8 at the bottom portion of the trench 6 is 2.0 MV/cm. This electric field strength is a level at which the gate oxide layer 8 is not broken down due to an electric field concentration and is equal to an electric field strength in a case where the p type deep layer 10 is not divided in the x-axis direction. Thus, even when a voltage of 650 V is applied to the drain electrode 13, the gate oxide layer 8 is not broken down and a breakdown voltage of 650 V can be achieved.

When the MOSFET is activated (for example, the gate voltage is 20 V, the drain voltage is 1 V, and the source voltage is 0 V), the gate voltage of 20 V is applied to the gate electrode 9. Thus, a channel is provided on a surface of the p type base region 3 being in contact with the trench 6. Electrons injected from the source electrode 11 flows to the current diffusion layer 2a of the n− type drift layer 2 through the n+ type source region 4 and the channel in the p type base region 3. Accordingly, electric current can flow between the source electrode 11 and the drain electrode 13 in a state where a region through which the electric current flows is expanded.

The p type deep layer 10 is divided into the multiple portions in the x-axis direction. Thus, the region through which the electric current flows can be expanded also in the n− type drift layer 2 between the portions of the p type deep layer 10, and the amount of electric current that flows between the source electrode 11 and the drain electrode 13 can be increased.

According to a calculation, the on-resistance in the present case is 2.8 mΩ·cm$^2$, and the on-resistance can be reduced by 0.2 mΩ·cm$^2$ from the on-resistance of 3.0 mΩ·cm$^2$ in a case where the p type deep layer 10 is not divided in the x-axis direction. Therefore, the on-resistance can be further reduced.

Figure 4:
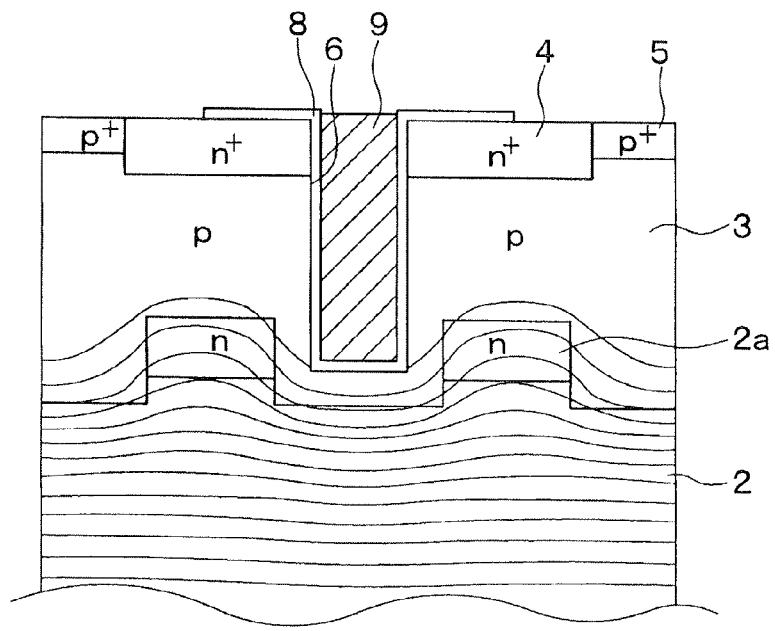
FIG. 4 is a diagram showing a simulation result of a potential distribution in a case where a voltage of 650 V is applied to a drain electrode.

As a reference, a potential distribution in a case where a voltage of 650 V is applied to the drain electrode 13 is simulated and the simulation result is shown in FIG. 4. FIG. 4 is a diagram showing a potential distribution of the SiC semiconductor device including the p type deep layer 10 according to the present embodiment in a cross-section corresponding to FIG. 2B. The p type base region 3 and the surface (uppermost part) of the p type deep layer 10 are set at 0 V and equipotential lines are shown at intervals of 10 V.

In the present embodiment, the p type deep layer 10 is divided in the x-axis direction. Because the equipotential lines is depressed by the p type deep layer 10, the intervals of the equipotential lines in the gate oxide layer 8 can be expanded on the sidewall of the trench 6 and the bottom of the trench 6. In the present case, the electric field in the gate oxide layer 8 is 2.0 MV/cm and it can be confirmed that the electric field is sufficiently reduced. Thus, even when the p type deep layer 10 is divided in the x-axis direction, an electric field concentration in the gate oxide layer 8 can be sufficiently relaxed.

Next, a manufacturing method of the MOSFET shown in FIG. 1 will be described with reference to FIG. 5A to FIG. 5F.

Figure 5A:
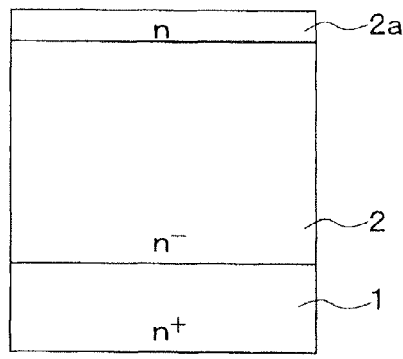
FIG. 5A to FIG. 5F are diagrams showing a part of a manufacturing process of the SiC semiconductor device according to the first embodiment.
Figure 5B:
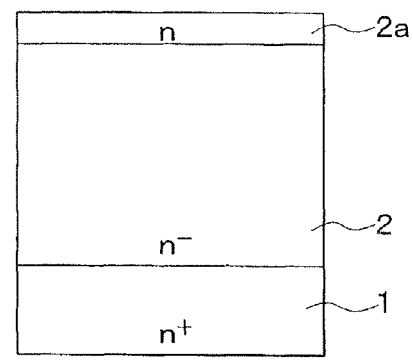

During a process shown in FIG. 5A and FIG. 5B, the n+ type substrate 1 is prepared. The n+ type substrate 1 has an n type impurity, such as phosphorous, concentration of, for example, $1.0 \times 10^{19}$ cm$^{-3}$ and has a thickness of about 300 μm. On a surface of the n+ type substrate 1, an n− type drift layer 2 is epitaxially formed. The n− type drift layer has an n type impurity, such as phosphorus, concentration of, for example, from $3.0 \times 10^{15}$ cm$^{-3}$ to $7.0 \times 10^{15}$ cm$^{-3}$, has a thickness of about 15 μm, and is made of SiC. The current diffusion layer 2a can be formed by implanting ions of n type impurities, such as nitrogen, to the n− type drift layer 2 or changing a condition of the epitaxial growth of the n− type drift layer 2 during the epitaxial growth.

Figure 5C:
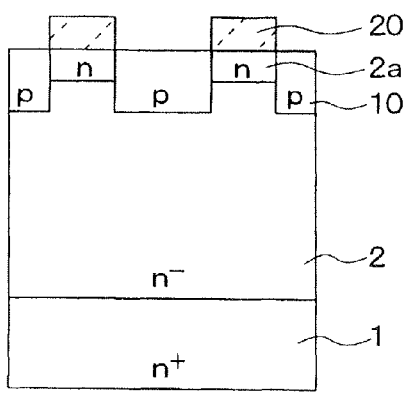
Figure 5D:
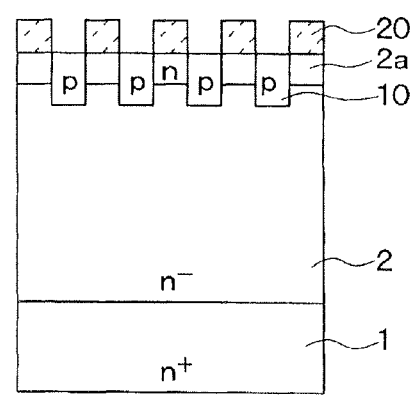

During a process shown in FIG. 5C and FIG. 5D, after a mask 20 made of such as LTO is formed on the surface of the n− type drift layer 2, the mask 20 is opened at a predetermined forming region of the p type deep layer 10 through a photolithography process. The mask 20 is opened so that opening portions having the same lattice pattern as the p type deep layer 10 are provided. Then, p type impurities, such as boron or aluminum are implanted from above the mask 20 and are activated. Accordingly, the p type deep layer 10 arranged in the lattice pattern is formed. The p type deep layer 10 has a boron or aluminum concentration of $1.0 \times 10^{17}$ cm$^{-3}$ to $1.0 \times 10^{19}$ cm$^{-3}$, has the thickness of 0.6 μm to 1.0 μm, and has the width of 1.5 μm to 2.0 μm. After that, the mask 20 is removed.

Figure 5E:
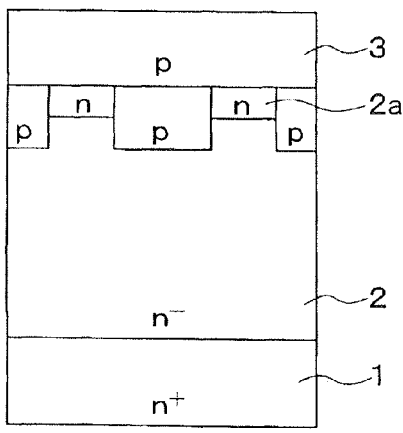
Figure 5F:
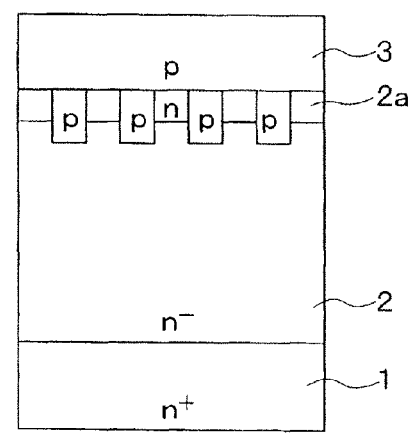

During a process shown in FIG. 5E and FIG. 5F, the p type base region 3 is formed by epitaxially forming a p type impurity layer having the p type impurity, such as boron or aluminum, concentration of for example, from $5.0 \times 10^{16}$ cm$^{-3}$ to $2.0 \times 10^{19}$ cm$^{-3}$ and having the thickness of about 2.0 μm on the surface of the n-type drift layer 2.

Figure 6A:
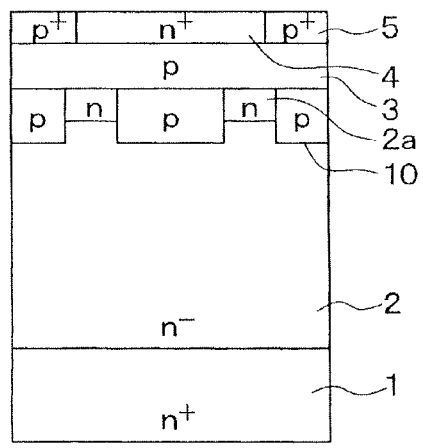
FIG. 6A to FIG. 6F are diagrams showing another part of the manufacturing process of the SiC semiconductor device according to the first embodiment.
Figure 6B:
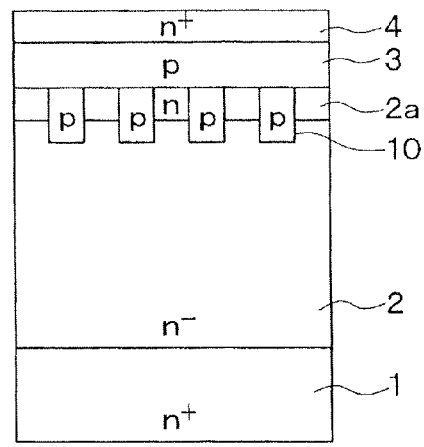

During a process shown in FIG. 6A and FIG. 6B, on the p type base region 3, a mask (not shown) made of, for example, LTO is formed, and the mask is opened at a predetermined forming region of the n+ type source region 4 through a photolithography process. After that, the n type impurities such as nitrogen are implanted. Then, after the mask used previously is removed, a mask (not shown) is formed again, and the mask is opened at a predetermined forming region of the p+ type body layer 5 through a photolithography process. Then, p type impurities such as aluminum are implanted and are activated. Thereby, the n+ type source region 4 and the p+ type body layer 5 are formed. The impurity concentration at the surface portion of the n+ type source region 4 is about $1.0 \times 10^{21}$ cm$^{-3}$ and the thickness of the n+ type source region 4 is about 0.3 μm, for example. The impurity concentration at the surface portion of the p+ type body layer 5 is about $1.0 \times 10^{21}$ cm$^{-3}$ and the thickness of the p type body layer 5 is about 0.3 for example. After that, the mask is removed.

Figure 6C:
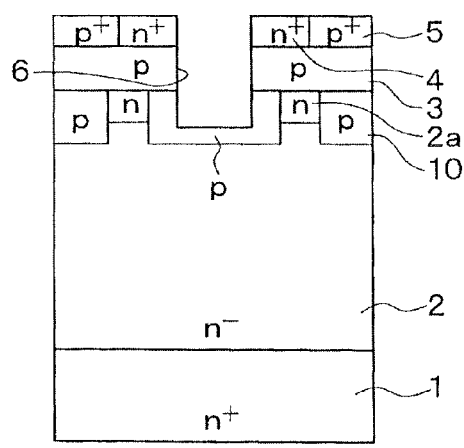
Figure 6D:
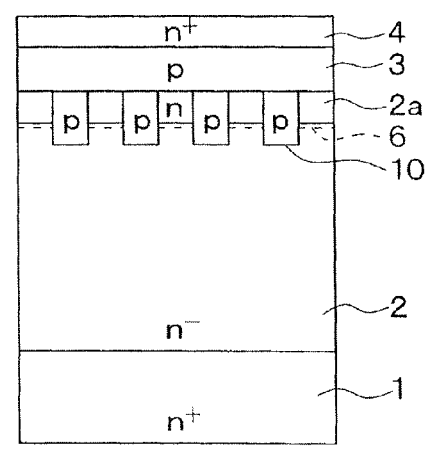

During a process shown in FIG. 6C and FIG. 6D, after an etching mask, which is not shown, is formed on the p type base region 3, the n+ type source region 4, and the p+ type body layer 5, the etching mask is opened at a predetermined forming region of the trench 6. Then, after an anisotropic etching is performed with the etching mask, an isotropic etching and a sacrificial oxidation are performed if needed, and thereby the trench 6 is formed. After this, the etching mask is removed.

Figure 6E:
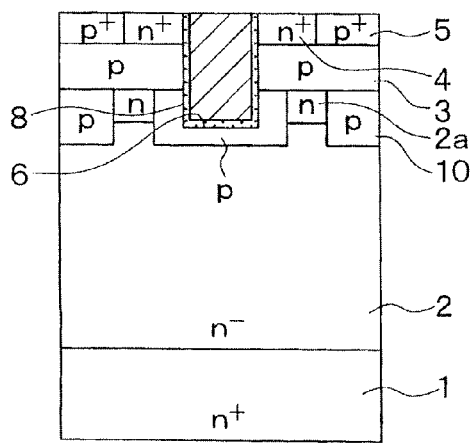
Figure 6F:
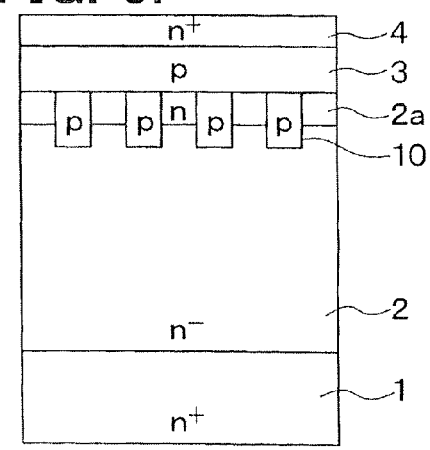

During a process shown in FIG. 6E and FIG. 6F, the gate oxide layer 8 is formed. Specifically, the gate oxide layer 8 is formed by gate oxidization (thermal oxidization) by a pyrogenic method using a wet atmosphere. Next, a polysilicon layer doped with the n type impurities is formed on the surface of the gate oxide layer 8 at a temperature of, for example, 600° C. so as to have a thickness of about 440 nm, and an etch back process is performed so that the gate oxide layer 8 and the gate electrode 9 remain in the trench 6.

Because a process after this is similar to a known process, it is not shown. After the insulating interlayer 12 is formed, the insulating interlayer 12 is patterned so that the contact holes extending to the n+ type source region 4 and the p+ type body layer 5 are formed, and the contact holes extending to the gate electrode 9 is formed on another cross section. Next, after a layer of an electrode material is formed so as to fill the contact holes, the source electrode 11 and the gate wiring are formed by patterning the layer. On the rear surface of the n+ type substrate 1, the drain electrode 13 is formed. Accordingly, the MOSFET shown in FIG. 1 is completed.

In the above-described manufacturing method, because the p type deep layer 10 is not formed by trench embedding in which a trench is provided and a p type layer is epitaxially grown so as to fill the trench, generation of a crystal defect due to a planarization process after filling the trench can be prevented.

Although the p type deep layer 10 can also be formed by an ion implantation from the surface of the p type base region 3, in the present embodiment, the ion implantation for forming the p type deep layer 10 is performed from the surface of the n− type drift layer 2. Thus, the p type deep layer 10 does not need to be formed by high-speed ion implantation with high energy, generation of a defect due to the high-speed ion implantation can be restricted.

As described above, the p type deep layer 10 is divided into the multiple portions in the x-axis direction. Thus, the region through which the electric current flows can be expanded also in the n− type drift layer 2 between the portions of the p type deep layer 10, and the amount of electric current that flows between the source electrode 11 and the drain electrode 13 can be increased. Therefore, the on-resistance of the SiC semiconductor device can be reduced compared with the conventional SiC semiconductor device.

Furthermore, because the portions of the p type deep layer 10 are disposed also between adjacent two lines of the trench 6, the intervals of the portions of the p type deep layer 10 can be reduced. Thus, the equipotential lines are restricted from entering portions between the portions of the p type deep layer 10, and an electric field concentration at the corners of the bottom of the p type deep layer 10 can be restricted.

Second Embodiment

A SiC semiconductor device according to a second embodiment will be described below.

Figure 7:
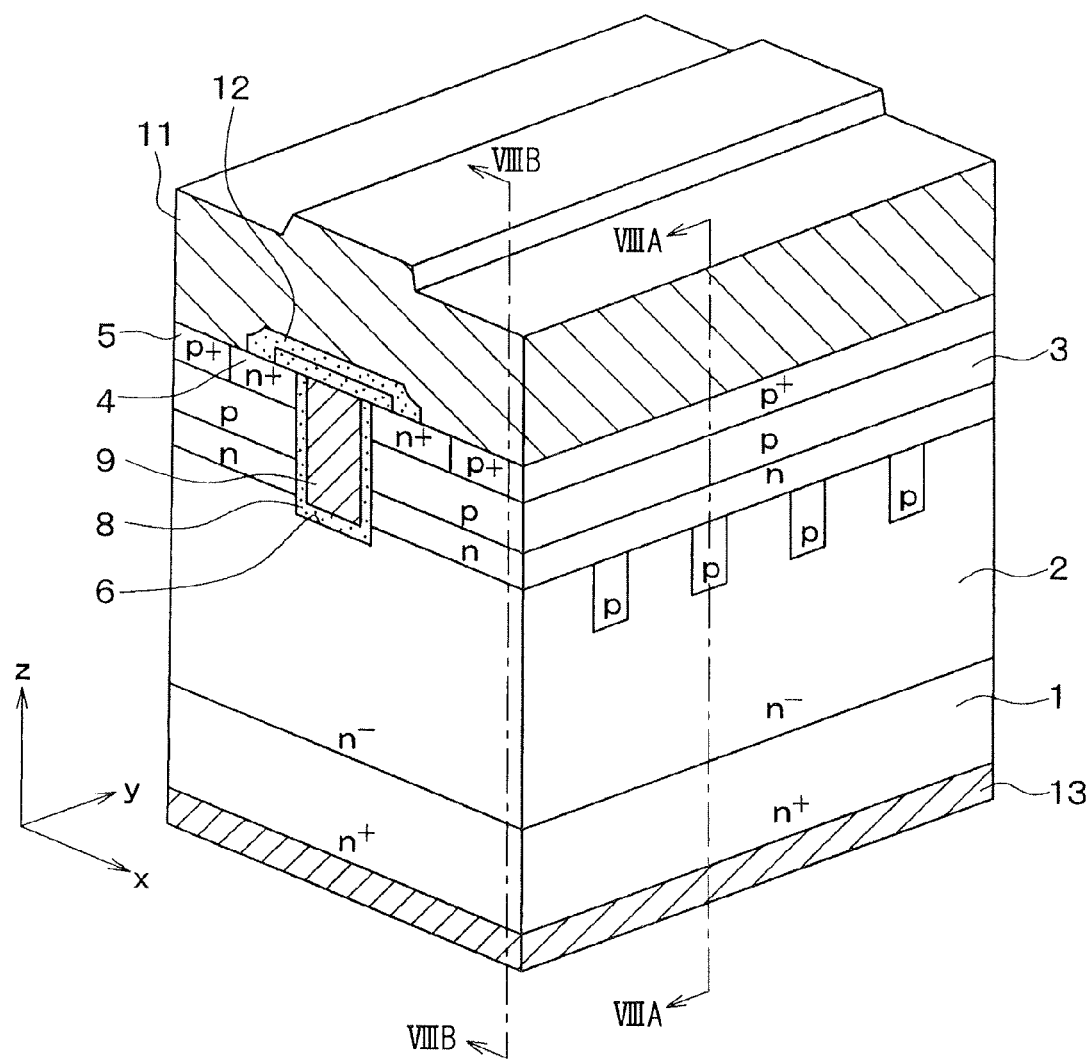
FIG. 7 is a perspective view of a MOSFET according to a second embodiment.
Figure 8A:
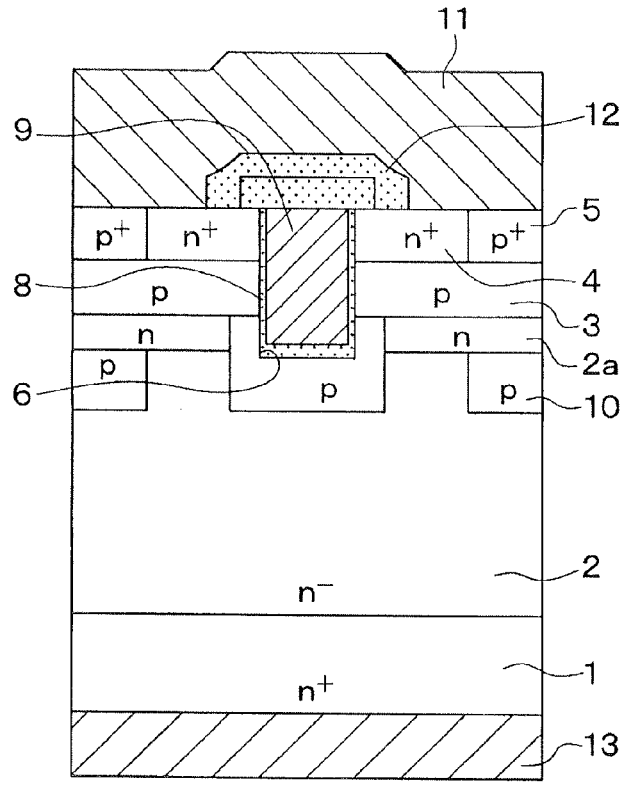
FIG. 8A is a cross-sectional view of the MOSFET taken along line VIIIA-VIIIA in parallel with an xz plane in FIG. 7
Figure 8B:
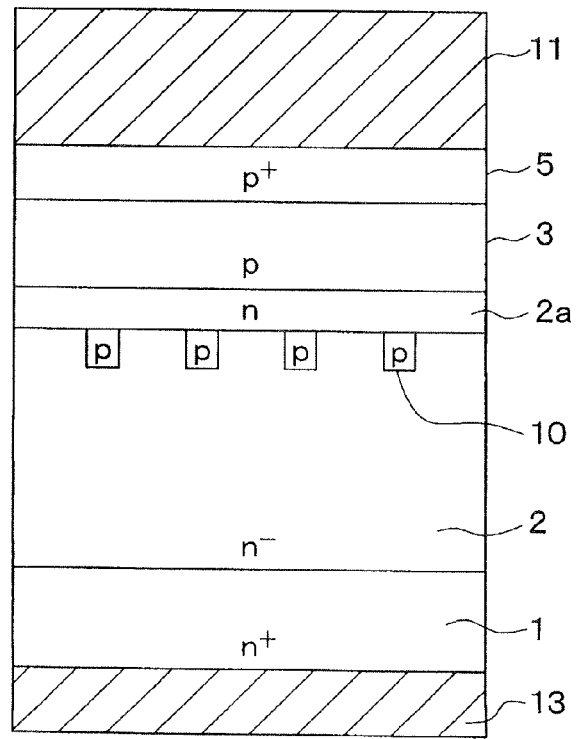
FIG. 8B is a cross-sectional view of the MOSFET taken along line VIIIB-VIIIB in parallel with a yz plane in FIG. 7.

As shown in FIG. 7, FIG. 8A and FIG. 8B, in the SiC semiconductor device according to the present embodiment, the depth, the impurity concentration, and the layout of the p type deep layer 10 are similar to those of the first embodiment. The current diffusion layer 2a is partially disposed above the p type deep layer 10. The current diffusion layer 2a extends to a position at about 1 μm from the sidewall of the trench 6. Thus, each portion of the p type deep layer 10 being in contact with the trench 6 is in contact with the p type base region 3, and each portion of the p type deep layer 10 not being in contact with the trench 6 is in contact with the current diffusion layer 2a and is separated from the p type base region 3.

In the present configuration, compared with the first embodiment, the area of the current diffusion layer 2a can be increased. Thus, electric current can flow between the source electrode 11 and the drain electrode 13 in a state where the region through which the electric current flows is expanded. Thus, the on-resistance can be reduced compared with the first embodiment.

Next, a manufacturing method of the trench gate MOSFET according to the present embodiment will be described with reference to FIG. 9A to FIG. 9F.

Figure 9A:
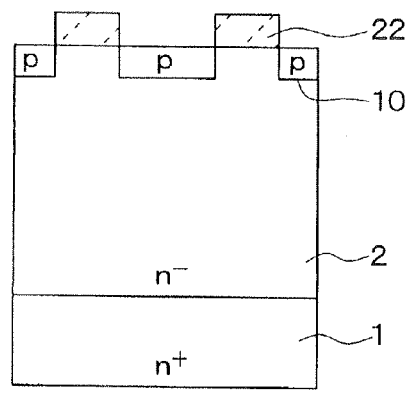
FIG. 9A to FIG. 9F are diagrams showing a part of a manufacturing process of the SiC semiconductor device according to the second embodiment.
Figure 9B:
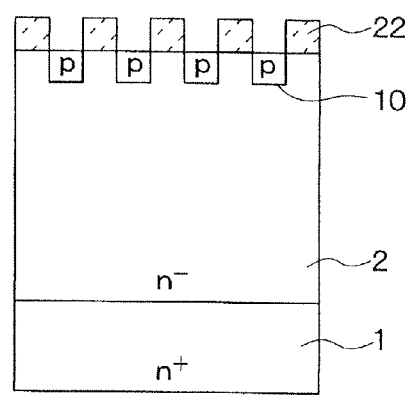

During a process shown in FIGS. 9A and 9B, the n− type drift layer 2 is epitaxially formed on the surface of the n+ type substrate 1 in a manner similar to the process shown in FIG. 5A and FIG. 5B in the first embodiment. After a mask 22 made of such as LTO is formed on the surface of the n− type drift layer 2, the mask 22 is opened at a predetermined forming region of a lower portion of the p type deep layer 10, that is, a portion of the p type deep layer 10 located under the current diffusion layer 2a, through a photolithography process. The mask 22 has the opening portions arranged in the lattice pattern as the p type deep layer 10. Then, p type impurities, for example, boron or aluminum, are ion-implanted through the opening portions of the mask 22 and are activated. Accordingly, the lower portion of the p type deep layer 10 is formed. After that, the mask 22 is removed.

Figure 9C:
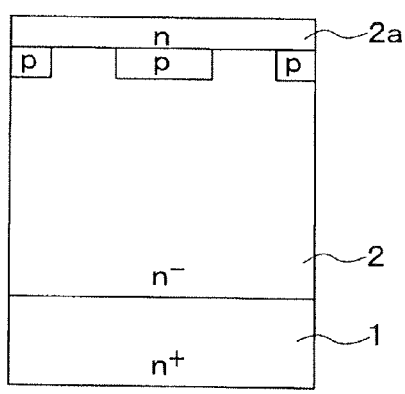
Figure 9D:
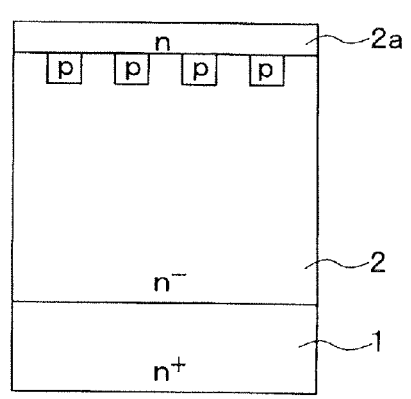

During a process shown in FIG. 9C and FIG. 9D, on the surfaces of the n-type drift layer 2 and the lower portion of the p type deep layer 10, the current diffusion layer 2a is epitaxially formed. For example, the current diffusion layer 2a has an impurity concentration of from $5.0 \times 10^{16}$ cm$^{-3}$ to $1.5 \times 10^{17}$ cm$^{-3}$ and has a thickness of from 0.3 μm to 0.7 μm.

Figure 9E:
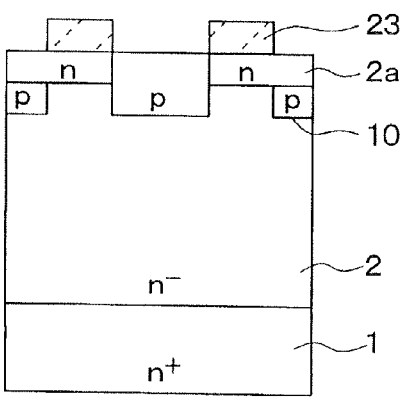
Figure 9F:
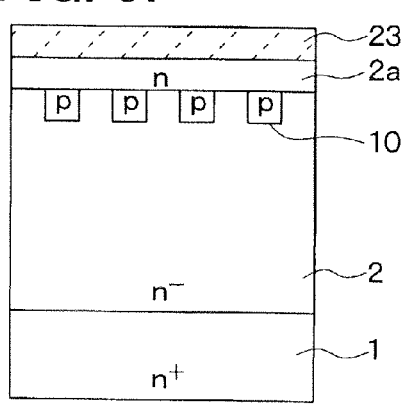

During a process shown in FIGS. 9E and 9F, after a mask 23 made of such as LTO is formed on the surface of the n-type drift layer 2, the mask 23 is opened at a predetermined forming region of an upper portion of the p type deep layer 10, that is, a portion of the p type deep layer 10 located at the same height as the current diffusion layer 2a. The mask 23 has opening portions arranged in the same pattern as the portions of the p type deep layer 10 being in contact with the trench 6. Then, p type impurities, for example, boron or aluminum, are implanted through the opening portions of the mask 23 and are activated. Accordingly, the upper portion of the p type deep layer 10 is formed. After that, the mask 23 is removed.

After the above-described process, processes similar to the processes shown in FIG. 5E and FIG. 5F and FIG. 6A to FIG. 6F are performed, and thereby the SiC semiconductor device shown in FIG. 7 is formed.

Third Embodiment

A SiC semiconductor device according to a third embodiment will be described with reference to FIG. 10.

Figure 10:
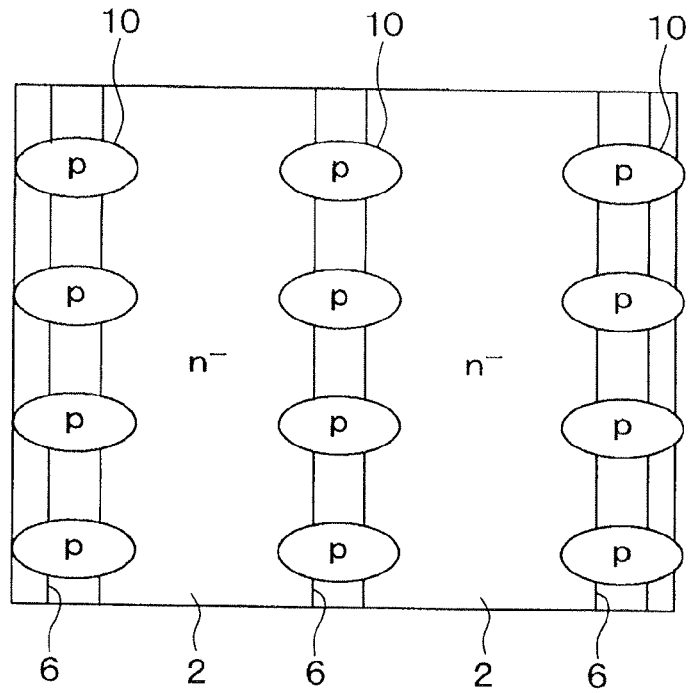
FIG. 10 is a cross-sectional view of a SiC semiconductor device according to a third embodiment.

FIG. 10 is a cross-sectional view showing a layout of a p type deep layer 10 in a trench gate MOSFET included in the SiC semiconductor device according to the present embodiment. The cross-section shown in FIG. 10 is taken along a line corresponding to the line III-III in FIG. 1.

In the present embodiment, the p type deep layer 10 includes a group of portions being in contact with the trench 6 and does not include a group of portions disposed between adjacent two lines of the trench 6.

The intervals of the portions of the p type deep layer 10 are increased in a direction perpendicular to the longitudinal direction of the trench 6. Thus, compared with the first embodiment and the second embodiment, the equipotential lines may enter upper positions between the portions of the p type deep layer 10, and electric field may concentrate at corners of a bottom of each portion of the p type deep layer 10. Thus, in the present embodiment, the corners of the bottom of each portion of the p type deep layer 10 are rounded. For example, each portion of the p type deep layer 10 has an ellipse cross-section on the xy plane.

In the present embodiment, the p type deep layer 10 includes only the group of portions being in contact with the p type deep layer 10. Thus, the region through which electric current flows can be increased and the on-resistance can be reduced compared with the first embodiment and the second embodiment. In addition, because the corners of the bottom of each portion of the p type deep layer 10 are rounded, an electric field concentration at the corners can be restricted. Thus, the SiC semiconductor device according to the present embodiment can have a breakdown voltage at the same level as the first embodiment. According to a simulation, the on-resistance of the SiC semiconductor device according to the present embodiment is 2.7 mΩ·cm². In addition, the electric field strength of the gate oxide layer 8 at the bottom of the trench 6 when a voltage of 650 V is applied to the drain electrode 13 is 2.3 MV/cm. As a result, the above-described effects can be achieved.

Fourth Embodiment

A SiC semiconductor device according to a fourth embodiment will be described with reference to FIG. 11.

Figure 11:
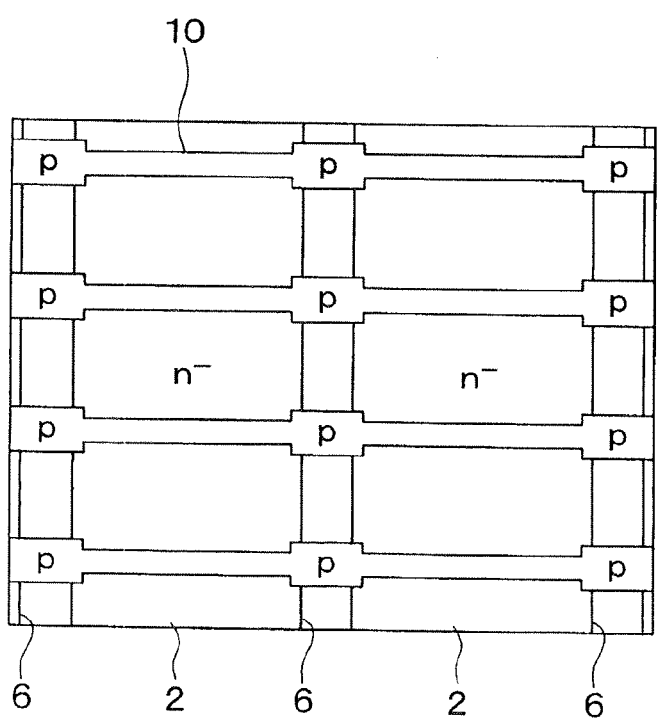
FIG. 11 is a cross-sectional view of a SiC semiconductor device according to a fourth embodiment.

FIG. 11 is a cross-sectional view showing a layout of a p type deep layer 10 in a trench gate MOSFET included in the SiC semiconductor device according to the present embodiment. The cross-section shown in FIG. 11 is taken along a line corresponding to the line III-III in FIG. 1.

In the present embodiment, the p type deep layer 10 includes a first group of portions being in contact with the trench 6 and a second group of portions disposed between adjacent two lines of the trench 6. Each portion in the first group is connected with adjacent portions in the second group. Thus, the p type deep layer 10 is not divided in the x-axis direction. Each portion in the first group has a width greater than each portion in the second group.

Because the width of each portion of the p type deep layer 10 disposed between adjacent two lines of the trench 6 is reduced, the region through which electric current flows can be expanded compared with a case where the p type deep layer 10 has a constant width. Thus, the on-resistance of the SiC semiconductor device can be reduced compared with the conventional SiC semiconductor device. According to a simulation, the on-resistance of the SiC semiconductor device according to the present embodiment is 2.8 mΩ·cm² similarly to the first embodiment. The breakdown voltage is also similar to that of the first embodiment. Thus, the SiC semiconductor device according to the present embodiment can have effects similar to those of the above-described embodiments.

Other Embodiments

Figure 12A:
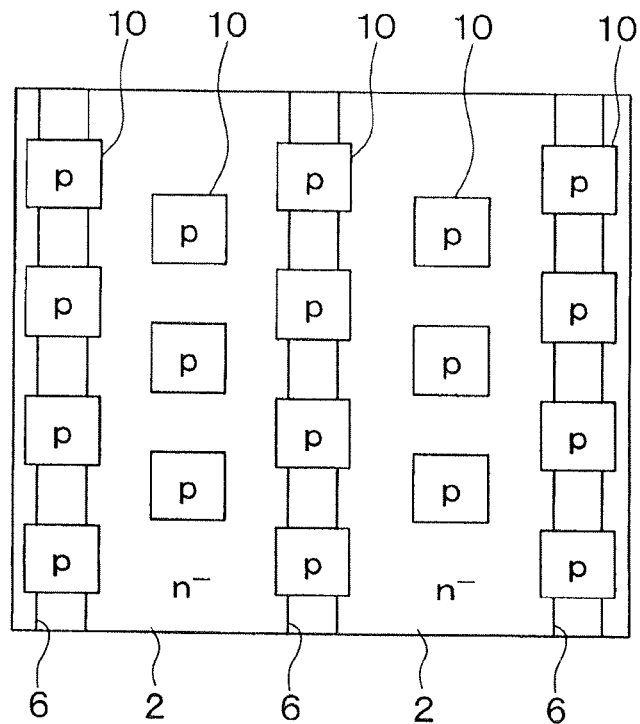
FIG. 12A and FIG. 12B are cross-sectional views of SiC semiconductor devices according to other embodiments.
Figure 12B:
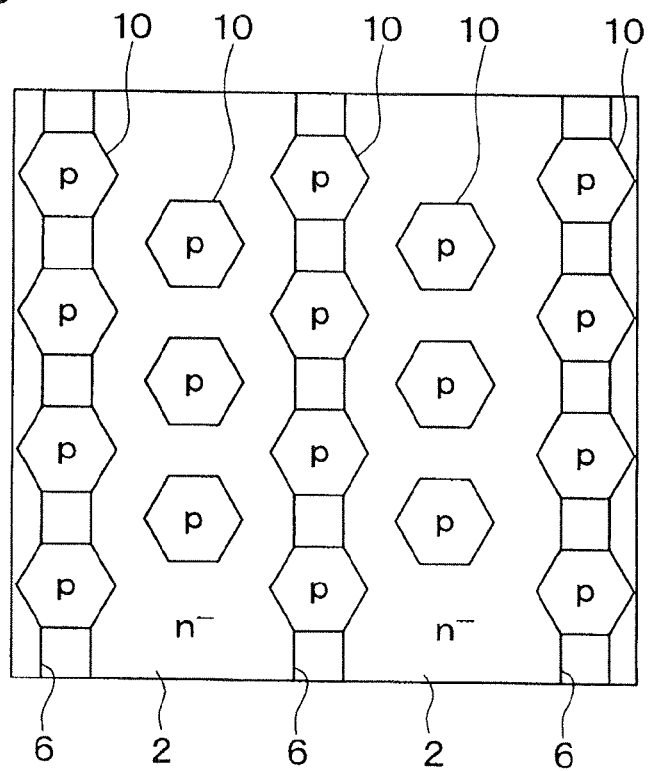

In the first embodiment and the second embodiment, each portion of the p type deep layer 10 has a quadrangular shape and the portions are arranged in the x-axis direction and the y-axis direction so as to form the lattice pattern. Each portion of the p type deep layer 10 may also have other shape and the p type deep layer 10 may also have other layout. FIG. 12A and FIG. 12B are diagrams showing other examples of the p type deep layer 10. The cross-section shown in FIG. 12A and FIG. 12B are taken along lines corresponding to the line III-III in FIG. 1.

In a SiC semiconductor device shown in FIG. 12A, the p type deep layer 10 includes a first group of portions being in contact with the trench 6 and a second group of portions disposed between adjacent two lines of the trench 6, each portion has a square shape, and the second group of portions is shifted in the y-axis direction with respect the first group of portions. In other words, the p type deep layer 10 is arranged in a staggered pattern. In a SiC semiconductor device shown in FIG. 12B, the p type deep layer 10 includes a first group of portions being in contact with the trench 6 and a second group of portions disposed between adjacent two lines of the trench 6, each portion has a hexagonal shape, and the second group of portions is shifted in the y-axis direction with respect to the first group of portions. In other words, the p type deep layer 10 is arranged in a honeycomb pattern. In this way, the layout of the p type deep layer 10 may be changed, and the shape of each portion of the p type deep layer 1 may be changed.

Figure 13:
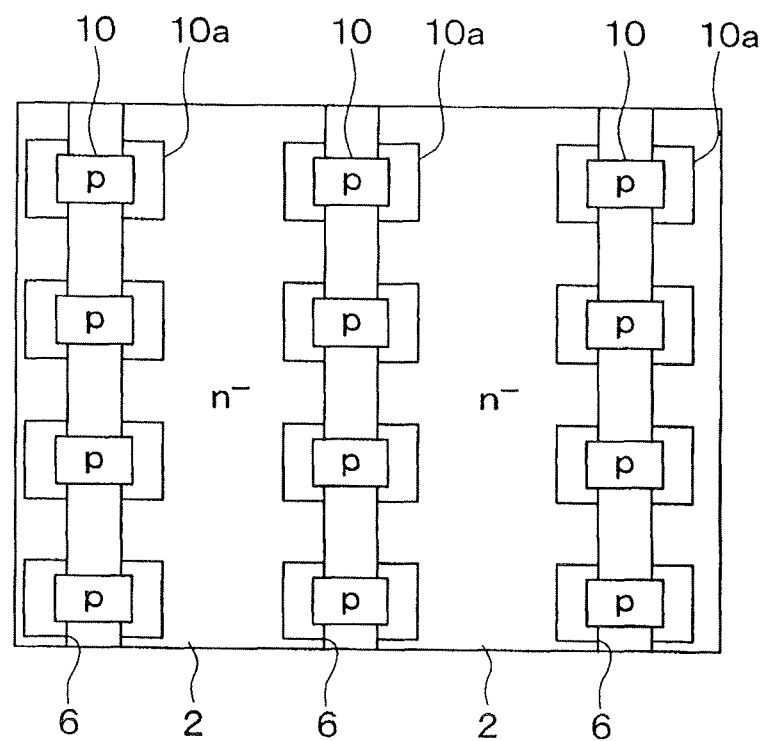
FIG. 13 is a cross-sectional view of a SiC semiconductor device according to another embodiment.

In the third embodiment, each portion of the p type deep layer 10 has the ellipse shape so as to restrict electric field concentration at corners of each portion. A similar effect can be achieved by other structure. FIG. 13 is a diagram showing another example of the p type deep layer 10. A cross-section shown in FIG. 13 is taken along a line corresponding to the line III-III in FIG. 1.

In a SiC semiconductor device shown in FIG. 13, a p type electric field relaxation layer 10a that surrounds each portion of the p type deep layer 10 is disposed. The p type electric field relaxation layer 10a has a lower impurity concentration than the p type deep layer 10. For example, the p type electric field relaxation layer 10a has a dimension larger than the p type deep layer 10 by 1 µm at each side. When each portion of the p type deep layer 10 is surrounded by the p type electric field relaxation layer 10a, effects similar to the third embodiment can be achieved.

Each portion of the p type deep layer 10 may be rounded also in a case where each portion has a shape other than an ellipse. The p type electric field relaxation layer 10a may be provided also in a case where each portion of the p type deep layer 10 has a hexagonal shape, other polygonal shape, a circular shape, or an ellipse shape. The p type electric field relaxation layer 10a may be provided also in a case where the corners of each portion of the p type deep layer 10 are rounded.

Each of the SiC semiconductor devices according to the above-described embodiments includes the MOSFETs having the inversion trench gate structure, as an example. The above-describe embodiments may also be applied to a SiC semiconductor device that includes MOSFETs having an accumulation trench gate structure. For example, in each of the SiC semiconductor devices according to the above-described embodiments, the gate oxide layer 8 is formed after forming an n type channel layer having an n type impurity, such as phosphorous, concentration of, for example, $1.0 \times 10^{16}$ cm$^{-3}$ on an inner wall of the trench 6. The n type channel layer is provided for forming a channel region. A thickness of the n type channel layer is set so that the MOSFET is normally off. For example, the thickness of the n type channel layer on a bottom face of the trench 6 is from 0.3 µm to 1.0 µm, and the thickness of the n type channel layer on the sidewall of the trench 6 is from 0.1 µm to 0.3 µm. In the present case, the p type deep layer 10 may have any layout described above. The dimension of each portion of the p type deep layer 10 corresponding to the trench 6 is set so that each portion can surround the corners of the bottom of the trench 6 through the channel layer.

In each of the above-described embodiments, the portions of the p type deep layer 10 are arranged in the direction perpendicular to the longitudinal direction of the trench 6 or the p type deep layer 10 extends in the direction perpendicular to the longitudinal direction of the trench 6. The p type deep layer 10 may also cross the longitudinal direction of the trench 6 diagonally. In the present case, the p type deep layer 10 may be arranged in line symmetry with respect to a line extending to the direction perpendicular to the longitudinal direction of the trench 6 so as to restrict bias of an equipotential line distribution.

In each of the above-described embodiments, the n channel type MOSFET in which a first conductivity type is the n type and a second conductivity type is the p type is explained as an example. The present invention can also be applied to a p channel type MOSFET in which a conductivity type of each components is inverted. In addition, in the above-described explanation, the MOSFET having the trench gate structure is described as an example. The present invention can also be applied to an IGBT having a trench gate structure. In a case where the SiC semiconductor device include the IGBTs, the conductivity type of the n+ type substrate 1 is changed from the n conductivity type to the p conductivity type, and other structure and a manufacturing method are similar to the method described in each of the above-described embodiments.

Although the gate oxide layer 8 formed by thermal oxidation is described as an example of a gate insulating layer, the gate insulating layer may also be an oxide layer not formed by thermal oxidation or may also be a nitride layer. The drain electrode 13 may also be formed after the source electrode 11 is formed.

What is claimed is:

1. A silicon carbide semiconductor device comprising:
    a substrate made of silicon carbide, the substrate having one of a first conductivity type and a second conductivity type, the substrate having first and second opposing surfaces;
    a drift layer disposed on the first surface of the substrate, the drift layer made of silicon carbide, the drift layer having the first conductivity type and having a lower impurity concentration than the substrate;
    a base region disposed on the drift layer, the base region made of silicon carbide and having the second conductivity type;
    a source region disposed at a surface portion of the base region, the source region made of silicon carbide, the source region having the first conductive type and having a higher impurity concentration than the drift layer;
    a trench provided from a surface of the source region to a depth deeper than the base region, the trench arranged in a stripe pattern that includes a plurality of lines extending in a predetermined direction;
    a gate insulating layer disposed on an inner wall of the trench;
    a gate electrode disposed on the gate insulating layer in the trench;
    a source electrode electrically coupled with the source region and the base region;
    a drain electrode located on the second surface of the substrate; and
    a deep layer disposed under the base region and located to a depth deeper than the trench, the deep layer having the second conductivity type, the deep layer divided into a first group of portions and a second group of portions disposed away from each other in a direction that crosses the predetermined direction, the first group of portions disposed at positions corresponding to the plurality of lines of the trench and arranged at equal intervals in the predetermined direction, the first group of portions surrounding corners of bottoms of the plurality of lines, the second group of portions disposed at center positions between adjacent two of the plurality of lines, wherein
    an inversion channel is provided at the surface portion of the base region located on the sidewall of the trench and electric current flows between the source electrode and the drain electrode through the source region and the drift layer by controlling a voltage applied to the gate electrode.

2. The silicon carbide semiconductor device according to claim 1, further comprising
    a current diffusion layer of the first conductivity type, the current diffusion layer disposed between the base region and the group of portions disposed between adjacent two of the plurality of lines.

3. The silicon carbide semiconductor device according to claim 1, wherein
    the deep layer are arranged in a lattice pattern in which the plurality of portions is arranged at equal intervals in a direction perpendicular to the predetermined direction.

4. The silicon carbide semiconductor device according to claim 1, wherein
    the deep layer are arranged in a staggered pattern in which the plurality of portions is arranged at equal intervals in the predetermined direction, and the group of portions disposed between adjacent two of the plurality of lines is shifted in the predetermined direction with respect to the group of portions surrounding the corners of the bottom of the trench.

5. The silicon carbide semiconductor device according to claim 1, wherein
   each of the plurality of portions has a polygonal shape, and the deep layer is arranged in a honeycomb pattern.

6. The silicon carbide semiconductor device according to claim 1, wherein
   the plurality of portions includes only the group of portions surrounding the corners of the bottom of the trench, and
   each of the plurality of portions has corners that are rounded.

7. The silicon carbide semiconductor device according to claim 1, further comprising
   an electric field relaxation region surrounding the deep layer, the electric field relaxation region having the second conductivity type, the electric field relaxation region having a lower impurity concentration than the deep layer.

8. A silicon carbide semiconductor device comprising:
   a substrate made of silicon carbide, the substrate having one of a first conductivity type and a second conductivity type, the substrate having first and second opposing surfaces;
   a drift layer disposed on the first surface of the substrate, the drift layer made of silicon carbide, the drift layer having the first conductivity type and having a lower impurity concentration than the substrate;
   a base region disposed on the drift layer, the base region made of silicon carbide and having the second conductivity type;
   a source region disposed at a surface portion of the base region, the source region made of silicon carbide, the source region having the first conductive type and having a higher impurity concentration than the drift layer;
   a trench provided from a surface of the source region to a depth deeper than the base region, the trench arranged in a stripe pattern including a plurality of lines extending in a predetermined direction;
   a gate insulating layer disposed on an inner wall of the trench;
   a channel layer disposed between the base region and the gate insulating layer in the trench, the channel layer made of silicon carbide and having the first conductivity type;
   a gate electrode disposed on the gate insulating layer in the trench;
   a source electrode electrically coupled with the source region and the base region;
   a drain electrode located on the second surface of the substrate; and
   a deep layer disposed under the base region and located to a depth deeper than the trench, the deep layer having the second conductivity type, the deep layer divided into first group of portions and a second group of portions disposed away from each other in a direction that crosses the predetermined direction, the first group of portions disposed at positions corresponding to the plurality of lines of the trench and arranged at equal intervals in the predetermined direction, the first group of portions surrounding corners of bottoms of the plurality of lines, the second group of portions disposed at center positions between adjacent two of the plurality of lines, wherein
   an accumulation channel is provided at the channel layer on the sidewall of the trench and electric current flows between the source electrode and the drain electrode through the source region and the drift layer by controlling a voltage applied to the gate electrode.

9. A silicon carbide semiconductor device comprising:
   a substrate made of silicon carbide, the substrate having one of a first conductivity type and a second conductivity type, the substrate having first and second opposing surfaces;
   a drift layer disposed on the first surface of the substrate, the drift layer made of silicon carbide, the drift layer having the first conductivity type and having a lower impurity concentration than the substrate;
   a base region disposed on the drift layer, the base region made of silicon carbide and having the second conductivity type;
   a source region disposed at a surface portion of the base region, the source region made of silicon carbide, the source region having the first conductive type and having a higher impurity concentration than the drift layer;
   a trench provided from a surface of the source region to a depth deeper than the base region, the trench extending in a predetermined direction;
   a gate insulating layer disposed on an inner wall of the trench;
   a gate electrode disposed on the gate insulating layer in the trench;
   a source electrode electrically coupled with the source region and the base region;
   a drain electrode located on the second surface of the substrate; and
   a deep layer disposed under the base region and located to a depth deeper than the trench, the deep layer having the second conductivity type, the deep layer including a plurality of sections extending in a direction that crosses the predetermined direction, each of the plurality of sections includes a plurality of portions located at positions corresponding to the trench and a plurality of portions located between adjacent two of the plurality of lines, each of the plurality of portions located between the adjacent two of the plurality of lines is narrower than each of the plurality of portions located at the positions corresponding to the trench, wherein
   an inversion channel is provided at the surface portion of the base region located on the sidewall of the trench and electric current flows between the source electrode and the drain electrode through the source region and the drift layer by controlling a voltage applied to the gate electrode.

10. The silicon carbide semiconductor device according to claim 9, wherein
    a current diffusion layer of the first conductivity type, the current diffusion layer disposed between the base region and the plurality of portions of the deep layer located between adjacent two of the plurality of lines.

11. A silicon carbide semiconductor device comprising:
    a substrate made of silicon carbide, the substrate having one of a first conductivity type and a second conductivity type, the substrate having first and second opposing surfaces;
    a drift layer disposed on the first surface of the substrate, the drift layer made of silicon carbide, the drift layer having the first conductivity type and having a lower impurity concentration than the substrate;
    a base region disposed on the drift layer, the base region made of silicon carbide and having the second conductivity type;
    a source region disposed at a surface portion of the base region, the source region made of silicon carbide, the source region having the first conductive type and having a higher impurity concentration than the drift layer;

a trench provided from a surface of the source region to a depth deeper than the base region, the trench arranged in a plurality of lines extending in a predetermined direction;

a gate insulating layer disposed on an inner wall of the trench;

a channel layer disposed between the base region and the gate insulating layer in the trench, the channel layer made of silicon carbide and having the first conductivity type;

a gate electrode disposed on the gate insulating layer in the trench;

a source electrode electrically coupled with the source region and the base region;

a drain electrode located on the second surface of the substrate; and a deep layer disposed under the base region and located to a depth deeper than the trench, the deep layer having the second conductivity type, the deep layer including a plurality of sections extending in a direction that crosses the predetermined direction, each of the plurality of sections includes a plurality of portions located at positions corresponding to the trench and a plurality of portions located between adjacent two of the plurality of lines, each of the plurality of portions located between adjacent two of the plurality lines is narrower than each of the plurality of portions located at the positions corresponding to the trench, wherein an accumulation channel is provided at the channel layer on the sidewall of the trench and electric current flows between the source electrode and the drain electrode through the source region and the drift layer by controlling a voltage applied to the gate electrode.

* * * * *